(12) United States Patent
Lee et al.

(10) Patent No.: US 11,850,744 B2
(45) Date of Patent: Dec. 26, 2023

(54) TRAVEL ROBOT FOR MOVING SUBSTRATE TRANSFER ROBOT IN CHAMBER

(71) Applicant: T-Robotics Co., Ltd., Osan-si (KR)

(72) Inventors: Soo Jong Lee, Suwon-si (KR); Eun Jae Choi, Gwangju-si (KR); Hyeon Ju Kim, Siheung-si (KR); Jun Young Kim, Suwon-si (KR)

(73) Assignee: T-Robotics Co., Ltd., Osan-si (KR)

( * ) Notice: Subject to any disclaimer, the term of this patent is extended or adjusted under 35 U.S.C. 154(b) by 0 days.

(21) Appl. No.: 17/899,365

(22) Filed: Aug. 30, 2022

(65) Prior Publication Data

US 2023/0115509 A1    Apr. 13, 2023

(30) Foreign Application Priority Data

Oct. 8, 2021    (KR) .................. 10-2021-0134357

(51) Int. Cl.
| | |
|---|---|
| *B25J 9/00* | (2006.01) |
| *B25J 9/04* | (2006.01) |
| *B25J 9/16* | (2006.01) |
| *B25J 11/00* | (2006.01) |

(52) U.S. Cl.
CPC ............ *B25J 9/044* (2013.01); *B25J 9/1669* (2013.01); *B25J 11/0095* (2013.01)

(58) Field of Classification Search
None
See application file for complete search history.

(56) References Cited

U.S. PATENT DOCUMENTS

| | | | | |
|---|---|---|---|---|
| 4,904,148 | A * | 2/1990 | Larsson | ............... B25J 9/04 |
| | | | | 901/23 |
| 6,514,032 | B1 * | 2/2003 | Saino | ............... B65G 49/067 |
| | | | | 414/744.1 |
| 8,434,992 | B2 * | 5/2013 | Tara | ............... B25J 9/044 |
| | | | | 414/941 |
| 9,457,464 | B2 * | 10/2016 | Kremerman | ......... B25J 9/107 |

(Continued)

FOREIGN PATENT DOCUMENTS

| | | |
|---|---|---|
| JP | 2001217296 A | 8/2001 |
| JP | 2005039047 A | 10/2007 |

(Continued)

*Primary Examiner* — Michael S Lowe
(74) *Attorney, Agent, or Firm* — David R. Stevens; Stevens Law Group

(57) ABSTRACT

A travel robot for moving a substrate transfer robot in a transfer chamber includes: an elevating part for driving an elevating drive shaft installed in the transfer chamber, a first travel link arm engaged with the elevating drive shaft, a second and a third travel link arm respectively having a first and a second driving motors installed therein, wherein two travel drive shafts are interlocked with the first driving motor and their corresponding travel output shafts, wherein the travel drive shafts and the travel output shafts are installed on the first travel link arm, wherein a rotation drive shaft interlocked with the second driving motor and a rotation output shaft interlocked with the rotation drive shaft and the substrate transfer robot are installed on the third travel link arm, and wherein the travel output shafts are engaged with the first and the third travel link arm.

11 Claims, 10 Drawing Sheets

(56) References Cited

U.S. PATENT DOCUMENTS

| | | | |
|---|---|---|---|
| 9,770,824 B2 * | 9/2017 | Hahakura | B25J 9/0018 |
| 10,695,903 B2 * | 6/2020 | Hashimoto | B25J 9/06 |
| 10,780,586 B2 * | 9/2020 | Kitahara | H01L 21/68707 |

FOREIGN PATENT DOCUMENTS

| | | |
|---|---|---|
| JP | 2011101912 A | 10/2013 |
| KR | 10-2016-0042880 | 4/2016 |
| KR | 10-2307687 | 10/2021 |

* cited by examiner

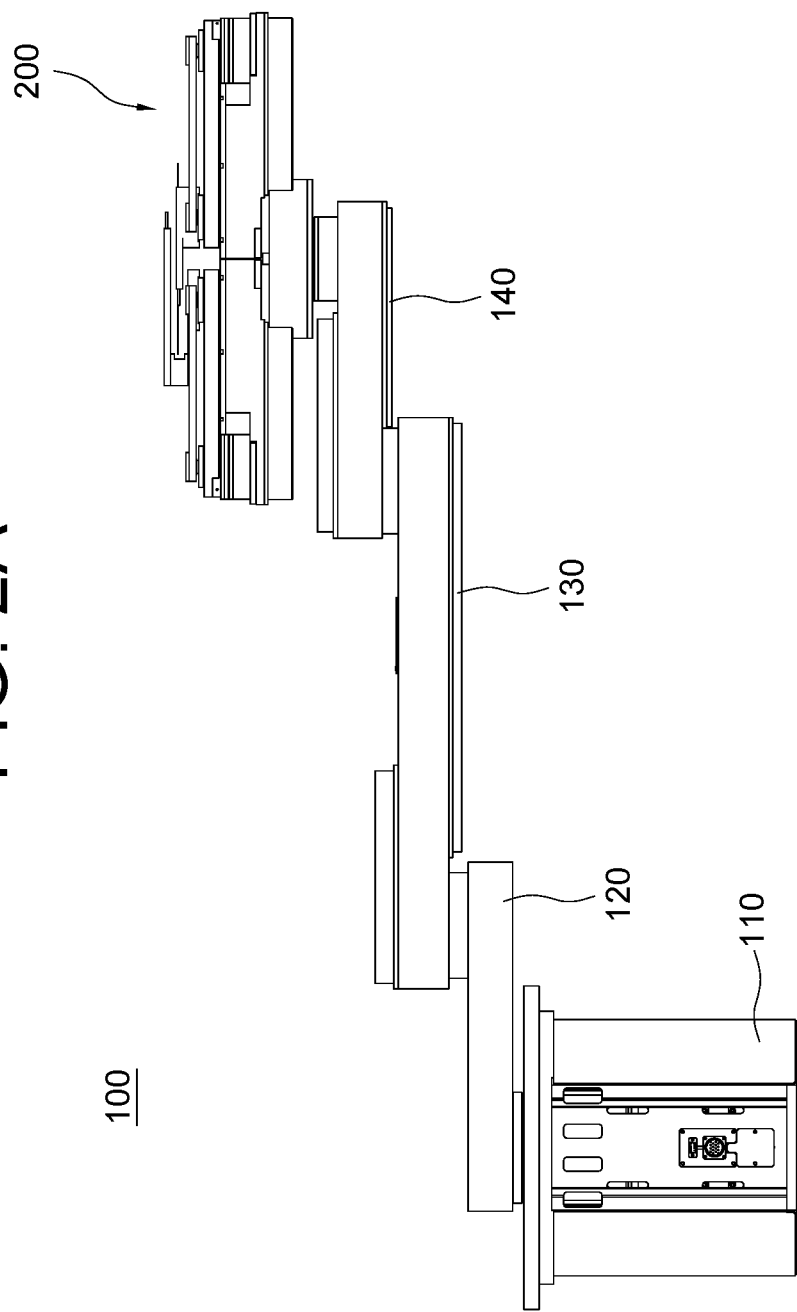

ated with the second travel output shaft, wherein a second opposite-end area of the second travel link arm is engaged with a third one-end area of the third travel link arm, and wherein a substrate transfer robot is installable on the third travel link arm.
TRAVEL ROBOT FOR MOVING SUBSTRATE TRANSFER ROBOT IN CHAMBER

CROSS REFERENCE OF RELATED APPLICATION

This present application claims the benefit of the earlier filing date of Korean non-provisional patent application No. 10-2021-0134357, filed Oct. 8, 2021, the entire contents of which being incorporated herein by reference.

FIELD OF THE DISCLOSURE

The present disclosure relates to a travel robot; and more particularly, to the travel robot that moves a substrate transfer robot within a chamber of a substrate processing equipment, wherein the substrate transfer robot is used for transferring substrates inside the chamber.

BACKGROUND OF THE DISCLOSURE

In general, a substrate such as a wafer for a semiconductor device, a glass substrate for a display device, or a glass substrate for a thin film solar cell is manufactured by performing various processes on the substrate. During these processes, the substrate is loaded and processed in a substrate processing equipment that provides optimal conditions for each of the processes.

Nowadays, in order to improve productivity, a cluster-type substrate processing equipment capable of collectively processing the substrate is being developed and used.

The cluster-type substrate processing equipment includes a load lock chamber for storing the substrate, a transfer chamber for transferring the substrate, and a plurality of processing chambers for performing each manufacturing process.

Additionally, a substrate transfer robot installed in the transfer chamber may transfer the substrate back and forth between the transfer chamber and the load lock chamber, among multiple transfer chambers, or in and out of the processing chambers.

In recent attempts to improve spatial efficiency by minimizing the installation area of the substrate processing equipment in a limited space, various kinds of research, such as Korean Patent No. 10-2200550, for changing a circular structure having the processing chambers installed at equal distances on an outer periphery of the transfer chamber to a tetragonal structure having the processing chambers installed on both sides of a transfer path of the transfer chamber, are conducted.

In such a substrate processing equipment having the tetragonal structure, a substrate transfer distance at the transfer chamber is increased for loading and unloading the substrate at the processing chambers.

Therefore, an attempt is made to transfer the substrate over a longer distance in the substrate processing equipment having the tetragonal structure by using a substrate transfer robot with a three-bar link as shown in U.S. Pat. No. 5,993,142.

However, the conventional substrate transfer robot with the three-bar link uses a single motor installed on a base axis to perform a linear motion by interlocking each link arm with each pulley structure, and thus there is a limitation in a maximum distance to which the substrate can be transferred. This being the case, if installation locations of the processing chambers exceed this maximum distance, a problem arises since the substrate cannot be transferred beyond this maximum distance using just one substrate transfer robot.

Therefore, in the tetragonal structure, moving of the substrate transfer robot is inevitably required in order for substrate transfer robot to travel to the installation locations of the processing chambers to transfer the substrate.

To this end, a method for installing rails and the like as the transport path within the transfer chamber to move the substrate transfer robot along the transport path is being suggested.

However, since the installation of the transport path such as the rails within the transfer chamber first requires additional structures for forming the transport path within the transfer chamber, prior to installing the substrate transfer robot on top of the additional structures, not only the installation of the substrate transfer robot but also subsequent maintenance of the substrate transfer robot are expected to be highly complicated processes.

PRIOR ART LITERATURE (Patent Document 0001) Korean Patent Publication No. 10-2200250 B1
(Patent Document 0002) Korean Patent Publication No. 5993142 B

SUMMARY OF THE DISCLOSURE

It is an object of the present disclosure to solve all the aforementioned problems.

It is another object of the present disclosure to provide a travel robot capable of moving a substrate transfer robot in a transfer chamber.

It is still another object of the present disclosure to facilitate easy installation of the travel robot for moving the substrate transfer robot in the transfer chamber.

It is still yet another object of the present disclosure to facilitate easy maintenance of the travel robot for moving the substrate transfer robot installed in the transfer chamber.

It is still yet another object of the present disclosure to provide the travel robot capable of moving the substrate transfer robot while maintaining a vacuum state in the transfer chamber.

In accordance with one aspect of the present disclosure, there is provided a travel robot for moving a substrate transfer robot in a transfer chamber, comprising: an elevating part for vertically and rotationally driving an elevating drive shaft installed in the transfer chamber; a first travel link arm having a first one-end area engaged with the elevating drive shaft; a second travel link arm having a first driving motor installed in a sealed inner space therein, wherein a first travel drive shaft interlocked with the first driving motor and a first travel output shaft interlocked with the first travel drive shaft are sealingly installed on a second one-end area of the second travel link arm, wherein a second travel drive shaft interlocked with the first driving motor and a second travel output shaft interlocked with the second travel drive shaft are sealingly installed on a second opposite-end area of the second travel link arm, and wherein the first travel output shaft is engaged with a first opposite-end area of the first travel link arm; and a third travel link arm having a second driving motor installed in a sealed inner space therein, wherein a rotation drive shaft interlocked with the second driving motor and a rotation output shaft interlocked with the rotation drive shaft are installed on a third opposite-end area of the third travel link arm, wherein the second travel output shaft of the second travel link arm is engaged with a third one-end area of the third travel link arm, and wherein the substrate transfer robot is engaged with the rotation output shaft.

As one example, the elevating part located in a lower outer region of a housing capable of sealing an inside of the transfer chamber has its upper end sealed to a transfer chamber through-hole formed on a lower region of the housing, and allows the elevating drive shaft to move up and down through the transfer chamber through-hole.

As another example, a rotational speed of the elevating drive shaft, a rotational speed of the first travel drive shaft and a rotational speed of the second travel drive shaft have a speed ratio of 1:2:2.

As another example, a rotational speed of the elevating drive shaft, a rotational speed of the first travel drive shaft, a rotational speed of the second travel drive shaft and a rotational speed of the rotation drive shaft have a speed ratio of 1:2:2:1.

As another example, the elevating drive shaft of the elevating part includes an elevating output shaft, which is interlocked with the elevating drive shaft and engaged with the first one-end area of the first travel link arm, and a rotational speed of the elevating output shaft, a rotational speed of the first travel output shaft and a rotational speed of the second travel output shaft have a speed ratio of 1:2:2.

As another example, the elevating drive shaft of the elevating part includes an elevating output shaft, which is interlocked with the elevating drive shaft and engaged with the first one-end area of the first travel link arm, and a rotational speed of the elevating output shaft, a rotational speed of the first travel output shaft, a rotational speed of the second travel output shaft and a rotational speed of the rotation output shaft have a speed ratio of 1:2:2:1.

As another example, the first travel output shaft is engaged with the first opposite-end area by a first linking member that has its first one-side engaged with the first travel output shaft and its first opposite-side engaged with the first opposite-end area, and the second travel output shaft is engaged with the third one-end area by a second linking member that has its second one-side engaged with the second travel output shaft and its second opposite-side engaged with the third one-end area.

As another example, a distance between the elevating drive shaft and the first travel drive shaft, a distance between the first travel drive shaft and the second travel drive shaft, and a distance between the second travel drive shaft and the rotation drive shaft have a distance ratio of 1:2:1.

As another example, the elevating drive shaft, the first travel drive shaft, the second travel drive shaft and the rotation drive shaft have their corresponding hollows formed thereon, and wherein wires for controlling the first driving motor, the second driving motor and the substrate transfer robot are installed inside the first travel link arm, the second travel link arm and the third travel link arm via the hollows.

As another example, the substrate transfer robot includes: transfer arm platform through which a first coupling hole, a second coupling hole and a third coupling hole are formed respectively at a center area, a fourth one-end area and a fourth opposite-end area thereof, wherein a first locking member, through which a first through-hole corresponding to the rotation drive shaft of the third travel link arm is formed, compartmentalizes the first coupling hole into a first upper space and a first lower space, wherein the first upper space is sealed by a first cover, wherein a second locking member, through which a second through-hole is formed, compartmentalizes the second coupling hole into a second upper space and a second lower space, wherein the second lower space is sealed by a second cover, wherein a third locking member, through which a third through-hole is formed, compartmentalizes the third coupling hole into a third upper space and a third lower space, wherein the third lower space is sealed by a third cover, wherein a link connecting member including a first blade and a second blade for link connection is fixedly engaged at a front area, with a direction of the front area being a direction of a processing chamber from the substrate transfer robot when the substrate transfer robot is positioned to transfer a substrate to the processing chamber coupled with the transfer chamber, and wherein a third linking member, inserted into the first lower space and fixedly engaged with the first locking member, is fixedly engaged with the rotation output shaft; a first transfer arm part including a (1_1)-st transfer link arm, a (1_2)-nd transfer link arm, a first common link arm, a (1_1)-st subordinate link arm parallel to the (1_1)-st transfer link arm, a (1_2)-nd subordinate link arm parallel to the (1_2)-nd transfer link arm, a (1_3)-rd subordinate link arm parallel to the first common link arm, and a first end effector, wherein a third driving motor and a first speed reducer, interlocked with the third driving motor to reduce a rotational speed of the third driving motor by half, are installed in a sealed inner space of the (1_1)-st transfer link arm, wherein a (1_1)-st transfer drive shaft interlocked with the first speed reducer and a (1_1)-st transfer output shaft interlocked with the (1_1)-st transfer drive shaft are sealingly installed on a (5_1)-st one-end area of the (1_1)-st transfer link arm, wherein a (1_2)-nd transfer drive shaft interlocked with the third driving motor and a (1_2)-nd transfer output shaft interlocked with the (1_2)-nd transfer drive shaft are sealingly installed on a (5_1)-st opposite-end area of the (1_1)-st transfer link arm, wherein the (1_1)-st transfer output shaft of the (1_1)-st transfer link arm is fixedly engaged with a (4_1)-st linking member that is inserted into the second upper space of the transfer arm platform to be fixedly engaged with the second locking member, wherein a (5_2)-nd one-end area of the (1_2)-nd transfer link arm is fixedly engaged with the (1_2)-nd transfer output shaft of the (1_1)-st transfer link arm through a first fixed coupling shaft, wherein the first common link arm is rotatably engaged with the first fixed coupling shaft, wherein a (5_3)-rd one-end area of the (1_1)-st subordinate link arm is rotatably engaged with the first blade of the link connecting member of the transfer arm platform, and a (5_3)-rd opposite-end area of the (1_1)-st subordinate link arm is rotatably engaged with a (5_4)-th one-end area of the first common link arm, wherein a (5_5)-th one-end area of the (1_2)-nd subordinate link arm is rotatably engaged with a (5_4)-th opposite-end area of the first common link arm, wherein a (5_6)-th one-end area of the (1_3)-rd subordinate link arm is rotatably engaged with a (5_5)-th opposite-end area of the (1_2)-nd subordinate link arm, and a (5_6)-th opposite-end area of the (1_3)-rd subordinate link arm is rotatably engaged with a (5_2)-nd opposite-end area of the (1_2)-nd transfer link arm, and wherein the first end effector is fixed to the (5_6)-th opposite-end area of the (1_3)-rd subordinate link arm to thereby support the substrate; and a second transfer arm part including a (2_1)-st transfer link arm, a (2_2)-nd transfer link arm, a second common link arm, a (2_1)-st subordinate link arm parallel to the (2_1)-st transfer link arm, a (2_2)-nd subordinate link arm parallel to the (2_2)-nd transfer link arm, a (2_3)-rd subordinate link arm parallel to the second common link arm, and a second end effector, wherein a fourth driving motor and a second speed reducer, interlocked with the fourth driving motor to reduce a rotational speed of the fourth driving motor by half, are installed in a sealed inner space of the (2_1)-st transfer link arm, wherein a (2_1)-st transfer drive shaft interlocked with the second speed reducer and a (2_1)-st transfer output shaft interlocked with the (2_1)-st transfer drive shaft are sealingly installed on a (6_1)-st one-end area of the (2_1)-st transfer link arm, wherein a (2_2)-nd transfer drive shaft interlocked with the fourth driving motor and a (2_2)-nd transfer output shaft interlocked with the (2_2)-nd transfer drive shaft are sealingly installed on a (6_1)-st opposite-end area of the (2_1)-st transfer link arm, wherein the (2_1)-st transfer output shaft of the (2_1)-st transfer link arm is fixedly engaged with a (4_2)-nd linking member that is inserted into the third upper space of the transfer arm platform to be fixedly engaged with the third locking member, wherein a (6_2)-nd one-end area of the (2_2)-nd transfer link arm is fixedly engaged with the (2-2)-nd transfer output shaft of the (2_1)-st transfer link arm through a second fixed coupling shaft, wherein the second common link arm is rotatably engaged with the second fixed coupling shaft, wherein a (6_3)-rd one-end area of the (2_1)-st subordinate link arm is rotatably engaged with the second blade of the link connecting member of the transfer arm platform, and a (6_3)-rd opposite-end area of the (2_1)-st subordinate link arm is rotatably engaged with a (6_4)-th one-end area of the second common link arm, wherein a (6_5)-th one-end area of the (2_2)-nd subordinate link arm is rotatably engaged with a (6_4)-th opposite-end area of the second common link arm, wherein a (6_6)-th one-end area of the (2_3)-rd subordinate link arm is rotatably engaged with a (6_5)-th opposite-end area of the (2_2)-nd subordinate link arm, and a (6_6)-th opposite-end area of the (2_3)-rd subordinate link arm is rotatably engaged with a (6_2)-nd opposite-end area of the (2_2)-nd transfer link arm, and wherein the second end effector is fixed to the (6_6)-th opposite-end area of the (2_3)-rd subordinate link arm to thereby support the substrate.

As another example, the first end effector is fixed to the (5_6)-th opposite-end area through a bracket, or the second end effector is fixed to the (6_6)-th opposite-end area through the bracket.

As another example, the transfer arm platform further includes: a first wiring hole bridging the first upper space and the second lower space; and a second wiring hole bridging the first upper space and the third lower space.

BRIEF DESCRIPTION OF THE DRAWINGS

The accompanying drawings used to explain example embodiments of the present disclosure are only part of example embodiments of the present disclosure and other drawings can be obtained based on the drawings by those skilled in the art of the present disclosure without inventive work.

FIG. 2A and FIG. 2B are drawings schematically illustrating the travel robot in accordance with one example embodiment of the present disclosure.

DETAILED DESCRIPTION OF THE PREFERRED EMBODIMENTS

Figure 1:
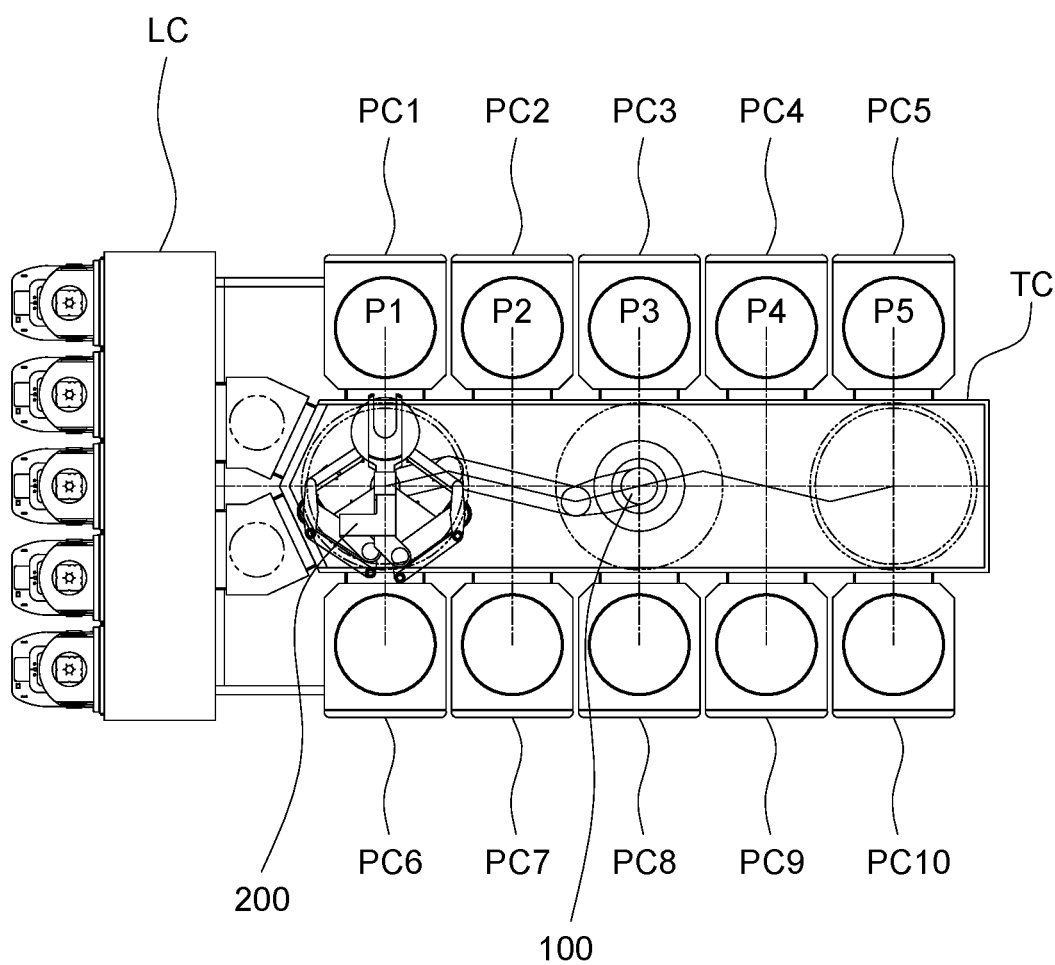
FIG. 1 is a drawing schematically illustrating an example of a cluster-type substrate processing equipment in which a travel robot is installed in accordance with one example embodiment of the present disclosure.

The following detailed description of the present disclosure refers to the accompanying drawings, which show by way of illustration a specific embodiment in which the present disclosure may be practiced, in order to clarify the objects, technical solutions and advantages of the present disclosure. These embodiments are described in sufficient detail to enable those skilled in the art to practice the present disclosure.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it is to be understood that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar functionality throughout the several views.

To allow those skilled in the art to carry out the present disclosure easily, the example embodiments of the present disclosure will be explained by referring to attached diagrams in detail as shown below.

FIG. 1 is a drawing schematically illustrating an example of a cluster-type substrate processing equipment in which a travel robot is installed in accordance with one example embodiment of the present disclosure.

FIG. 1 is related to the substrate processing equipment in which each set comprised of five processing chambers is installed on each side of a transfer chamber TC with a tetragonal structure (i.e. 10 processing chambers in total; PC 1 to PC 10) to process substrates. Herein, the travel robot 100 may be installed inside the transfer chamber TC, and move the substrate transfer robot 200 to each location corresponding to each position of each of the processing chambers.

For example, the travel robot 100 may move the substrate transfer robot 200 to a location corresponding to a substrate position P1 of a processing chamber PC1 and then rotate the substrate transfer robot 200 to make the substrate transfer robot 200 face the processing chamber PC1 so that the substrate transfer robot 200 is able to load or unload the substrate onto or from the processing chamber PC1.

Also, the travel robot 100 may move the substrate transfer robot 200 to a location corresponding to a substrate position P5 of a processing chamber PC10 and then rotate the substrate transfer robot 200 to make the substrate transfer robot 200 face the processing chamber PC10 so that the substrate transfer robot 200 is able to load or unload the substrate onto or from the processing chamber PC10.

Meanwhile, FIG. 1 is exemplarily illustrating the substrate processing equipment to have each set comprised of five processing chambers installed on each side of the transfer chamber TC (thus, PC1 to PC5 on one side and PC6 to PC10 on the other side), but the present disclosure is not limited thereto and the number of processing chambers installed on each side of the transfer chamber TC may change as needed.

Figure 2B:
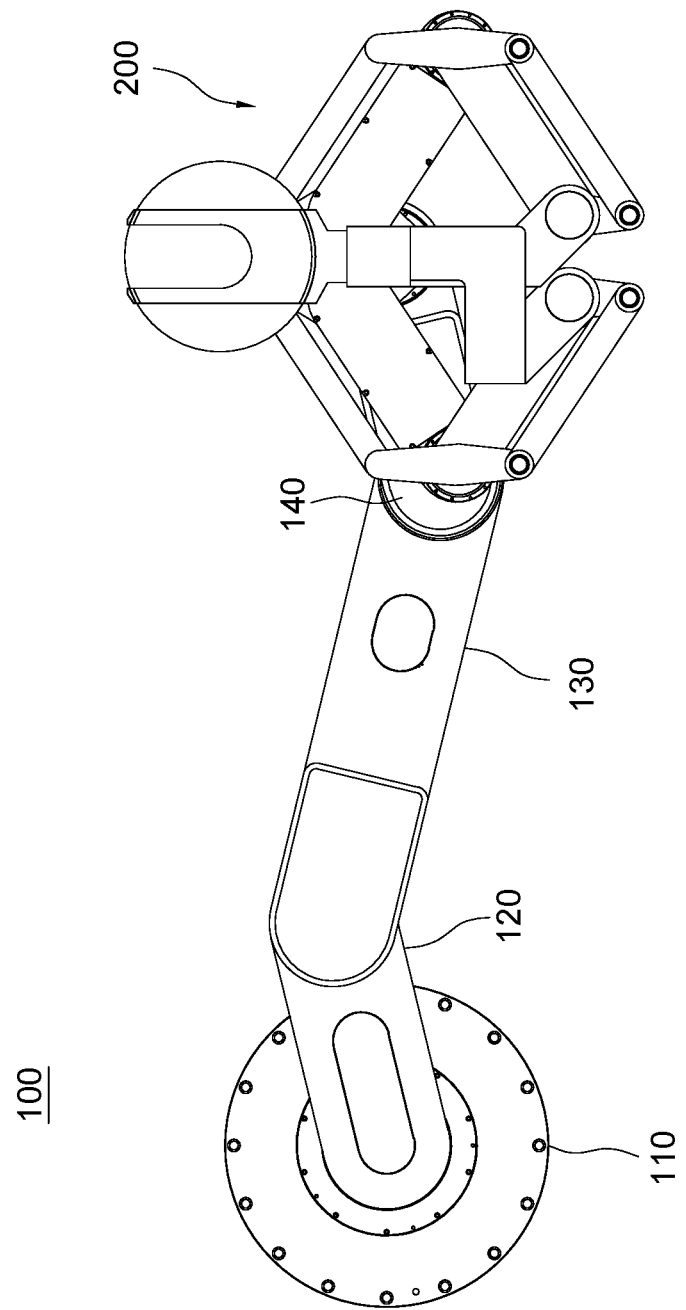

FIG. 2A and FIG. 2B are drawings schematically illustrating the travel robot 100 in accordance with one example embodiment of the present disclosure.

Hereinafter, expressions "coupled with" and "engaged with" are used interchangeably to explain configurations where two components are combined, or combined to be moved together, within the travel robot, between the travel robot and the substrate transfer robot, or within the substrate transfer robot, according to corresponding explanations where the respective expressions are used.

By referring to FIG. 2A and FIG. 2B, the travel robot 100 may include an elevating part 110, a first travel link arm 120, a second travel link arm 130 and a third travel link arm 140.

First, the elevating part 110 may vertically and rotationally drive an elevating drive shaft installed in the transfer chamber.

Herein, the elevating part 110 may be located in a lower outer region of a housing capable of sealing an inside of the transfer chamber and have its upper end sealed to a transfer chamber through-hole formed on a lower region of the housing. Also, the elevating part 110 may allow the elevating drive shaft to move up and down through the transfer chamber through-hole. Accordingly, the travel robot 100 may adjust upper and lower positions of the substrate transfer robot 200 so that the substrate transfer robot 200 is positioned at an appropriate height for loading or unloading the substrates onto or from the processing chamber and the like.

Also, the elevating part 110 may perform an operation of rotating the elevating drive shaft in addition to vertically driving the elevating drive shaft. Accordingly, the travel robot 100 may move the substrate transfer robot 200 in various directions according to a rotation angle of the elevating part 110.

Next, a first travel link arm 120 may have its first one-end area engaged with the elevating drive shaft of the elevating part 110, a second travel link arm 130 may have its second one-end area rotatably engaged with a first opposite-end area of the first travel link arm 120, a third travel link arm 140 may have its third one-end area rotatably engaged with a second opposite-end area of the second travel link arm 130, and the third travel link arm 140 may have its third opposite-end area engaged with the substrate transfer robot 200.

Further, in a state where the travel robot 100 has been fixed at a specific position in the transfer chamber, the substrate transfer robot 200 may be moved along a substrate transfer path in the transfer chamber by rotational movements of the first travel link arm 120, the second travel link arm 130 and the third travel link arm 140 so that the substrate transfer robot 200 may be moved to a set position such as a position for loading or unloading the substrates onto or from the processing chamber. Also, a vertical position of the substrate transfer robot 200 may be adjusted by a vertical movement of the elevating part 110 so that the substrate transfer robot 200 is able to load or unload the substrates onto or from the processing chamber, etc.

Figure 3:
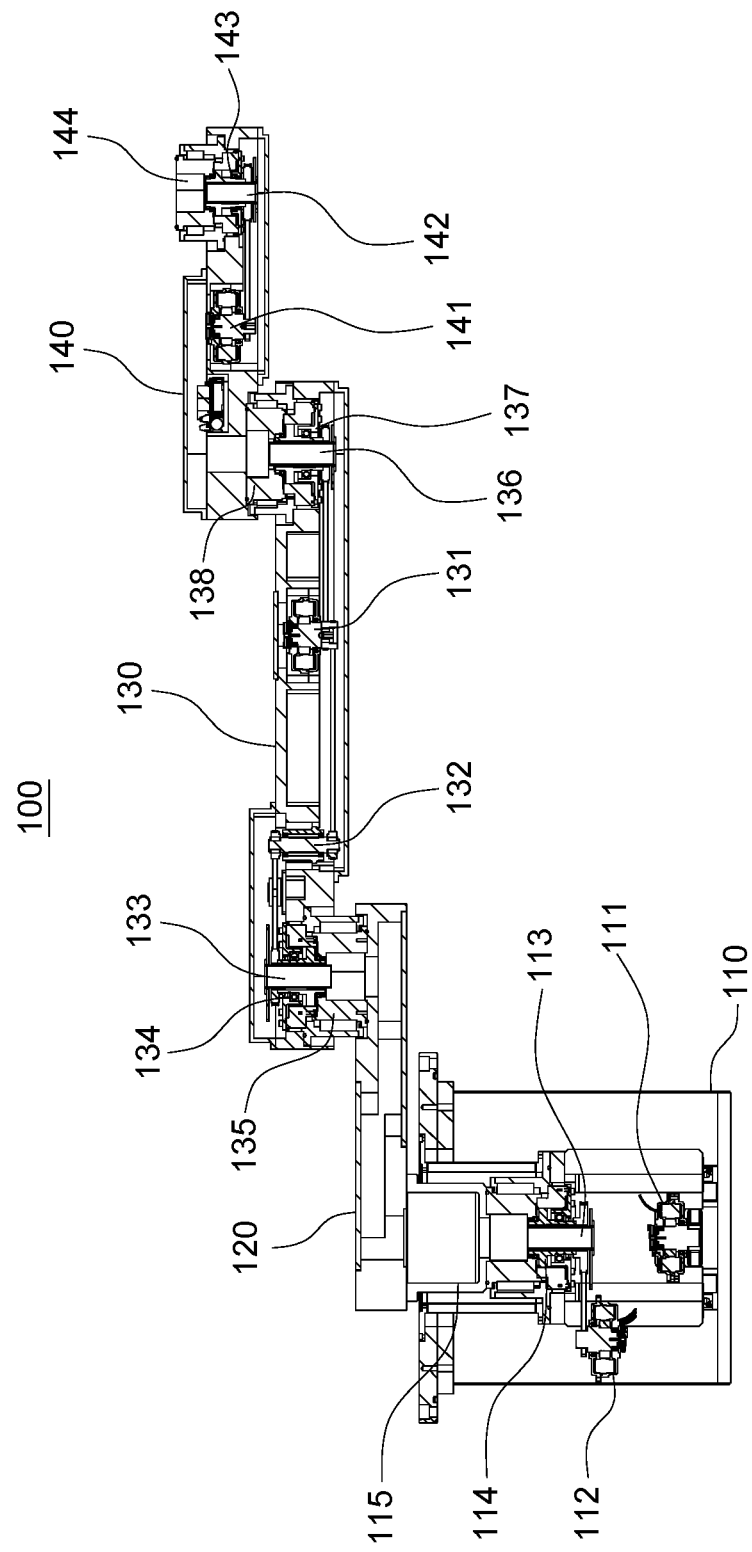
FIG. 3 is a drawing schematically illustrating a cross-sectional view of the travel robot in accordance with one example embodiment of the present disclosure.

The travel robot 100 in accordance with one example embodiment of the present disclosure is further described in detail as follows by referring to FIG. 3.

First, the elevating part 110 may include the elevating drive shaft 113 that performs vertical movements and rotational movements.

In addition, a driving motor 111 for generating a driving force to drive the elevating drive shaft 113 up and down and a driving motor 112 for generating a driving force to rotate the elevating drive shaft 113 may be installed in the elevating part 110.

Further, the first one-end area of the first travel link arm 120 may be coupled with the elevating drive shaft 113 of the elevating part 110.

Herein, an elevating output shaft 114 interlocked with the elevating drive shaft 113 may be formed on the elevating drive shaft 113, and this elevating output shaft 114 may in turn be engaged with the first one-end area of the first travel link arm 120.

Also, a linking member 115 may be used for engaging the elevating output shaft 114 with the first one-end area of the first travel link arm 120. Herein, one side of the linking member 115 may be engaged with the elevating output shaft 114 and the opposite side of the linking member 115 may be engaged with the first one-end area of the first travel link arm 120.

Herein, when fixedly engaging the elevating drive shaft 113 and the first one-end area of the first travel link arm 120, sealing members such as an O-ring, a gasket, etc. may be additionally used to improve sealing at a coupling area between the elevating drive shaft 113 and the first one-end area of the first travel link arm 120. Since a configuration of adding the sealing members, such as the O-ring, the gasket, etc., may be similarly applied to other coupling areas to be described hereinafter, a description thereof is omitted in the following description of the present disclosure.

Accordingly, it is possible not only to facilitate coupling of the first travel link arm 120 to the elevating part 110 but also possible to facilitate easy removal of the first travel link arm 120 from the elevating part 110 in the transfer chamber for maintenance.

Next, the second travel link arm 130 may have a first driving motor 131 installed in a sealed inner space therein, wherein a first travel drive shaft 133 interlocked with the first driving motor 131 and a first travel output shaft 134 interlocked with the first travel drive shaft 133 may be sealingly installed on the second one-end area of the second travel link arm 130, and wherein a second travel drive shaft 136 interlocked with the first driving motor 131 and a second travel output shaft 137 interlocked with the second travel drive shaft 136 may be sealingly installed on the second opposite-end area of the second travel link arm 130.

Herein, the interlocking between the first driving motor 131 and the first travel drive shaft 133 and the interlocking between the first driving motor 131 and the second travel drive shaft 136 may be respectively achieved by using a pulley mechanism, but the present disclosure is not limited thereto, and various methods, such as a gear method, etc., may be used for transmitting rotational force.

In addition, the first travel drive shaft 133 and the second travel drive shaft 136 may rotate in opposite directions from each other. Also, a pair of the first travel drive shaft 133 and the first travel output shaft 134, and a pair of the second travel drive shaft 136 and the second travel output shaft 137 may be configured as each speed reducer, and it may be the case that the same type of speed reducers are installed in opposite directions from each other.

Further, a driving force position conversion unit 132 may be installed in between the first driving motor 131 and the first travel drive shaft 133 to compensate for a positional difference between a position of an output shaft of the first driving motor 131 and a position of an input shaft of the first travel drive shaft 133. Herein, when the position of the output shaft of the first driving motor 131 is located upwards, as opposed to the case where the position of the output shaft of the first driving motor 131 is located downwards as shown in FIG. 3, the driving force position conversion unit 132 may instead be located in between the first travel driving motor 131 and the second travel drive shaft 136.

In addition, the first travel output shaft 134 of the second travel link arm 130 may be engaged with the first opposite-end area of the first travel link arm 120.

Herein, a first linking member 135 may be used for engaging the first travel output shaft 134 with the first opposite-end area of the first travel link arm 120. Herein, one side of the first linking member 135 may be fixedly engaged with the first travel output shaft and the opposite side of the first linking member 135 may be fixedly engaged with the first opposite-end area of the first travel link arm 120.

Accordingly, a separate device for transmitting driving force within the first travel link arm 120 is no longer required, and accordingly the thickness of the first travel link arm 120 may be reduced. Also, the first travel link arm 120 may be configured as a bar shape since no separate components are installed inside the first travel link arm 120, and accordingly it is possible to increase the strength of the first travel link arm 120 to support the travel robot 100 and the substrate transfer robot.

Next, the third travel link arm 140 may have a second driving motor 141 installed in a sealed inner space therein, wherein a rotation drive shaft 142 interlocked with the second driving motor 141 and a rotation output shaft 143 interlocked with the rotation drive shaft 142 may be installed on the third opposite-end area of the third travel link arm 140.

Herein, the interlocking between the second driving motor 141 and the rotation drive shaft 142 may be achieved by using the pulley mechanism, but the present disclosure is not limited thereto.

Also, a pair of the rotation drive shaft 142 and the rotation output shaft 143 may be configured as the speed reducer.

In addition, the third one-end area of the third travel link arm 140 may be engaged with the second travel output shaft 137 of the second travel link arm 130.

Herein, a second linking member 138 may be used for engaging the third one-end area of the third travel link arm 140 with the second travel output shaft 137. Herein, one side of the second linking member 138 may be fixedly engaged with the second travel output shaft 137 and the opposite side of the second linking member 138 may be fixedly engaged with the third one-end area of the third travel link arm 140.

Further, the rotation output shaft 143 installed on the third opposite-end area of the third travel link arm 140 may be engaged with the substrate transfer robot.

Herein, a linking member 144 may be used for engaging the rotation output shaft 143 of the third travel link arm 140 with the substrate transfer robot. Herein, one side of the linking member 144 may be fixedly engaged with the rotation output shaft 143 and the opposite side of the linking member 144 may be fixedly engaged with the substrate transfer robot.

As described above, the travel robot 100 in accordance with one example embodiment of the present disclosure may enable the substrate transfer robot to linearly move along the substrate transfer path in the transfer chamber by rotational movements of the elevating drive shaft 113, the first travel drive shaft 133 and the second travel drive shaft 136.

Herein, a distance between the elevating drive shaft 113 and the first travel drive shaft 133, a distance between the first travel drive shaft 133 and the second travel drive shaft 136 and a distance between the second travel drive shaft 136 and the rotation drive shaft 142 may be configured to have a distance ratio of 1:2:1, so that a traveling distance of the travel robot 100 is maximized. Herein, the length of the second travel link arm 130 may be made to correspond to a distance between both ends of the transfer chamber.

Herein, for the linear movement of the substrate transfer robot, a rotational speed of the first travel link arm 120, a rotational speed of the second travel link arm 130 and a rotational speed of the third travel link arm 140 may have a speed ratio of 1:2:2.

In other words, a rotational speed of the elevating drive shaft 113, a rotational speed of the first travel drive shaft 133 and a rotational speed of the second travel drive shaft 136 may be made to have the speed ratio of 1:2:2, or a rotational speed of the elevating output shaft 114, a rotational speed of the first travel output shaft 134 and a rotational speed of the second travel output shaft 137 may be made to have the speed ratio of 1:2:2.

Meanwhile, a direction in which the substrate transfer robot is headed may be maintained the same while being moved by the travel robot 100, and for this purpose, a rotational speed of the rotation drive shaft 142 driven by the second driving motor 141 may be adjusted by interlocking with the first driving motor 131.

In other words, the rotational speed of the elevating drive shaft 113, the rotational speed of the first travel drive shaft 133, the rotational speed of the second travel drive shaft 136 and the rotational speed of the rotation drive shaft 142 may be made to have a speed ratio of 1:2:2:1, or the rotational speed of the elevating output shaft 114, the rotational speed of the first travel output shaft 134, the rotational speed of the second travel output shaft 137 and a rotational speed of the rotation output shaft 143 may be made to have the speed ratio of 1:2:2:1, so that the direction of the substrate transfer robot is maintained the same.

Also, in a state where the substrate transfer robot is located at the set position in the transfer chamber by the travel robot 100, the direction of the substrate transfer robot may be adjusted by a rotational movement of the rotation drive shaft 142 generated by the second driving motor 141, such that the substrate transfer robot may transfer the substrates along its adjusted direction Further, in the travel robot 100 according to one example embodiment of the present disclosure, the elevating drive shaft 113, the first travel drive shaft 133, the second travel drive shaft 136 and the rotation drive shaft 142 may have their corresponding hollows formed thereon, and wires for controlling the first driving motor 131, the second driving motor 141 and the substrate transfer robot may be installed inside the first travel link arm 120, the second travel link arm 130 and the third travel link arm 140 via the hollows. Accordingly, the airtightness of the transfer chamber may be improved.

Next, the substrate transfer robot 200 in accordance with one example embodiment of the present disclosure corresponding to the travel robot 100 may be described as follows.

Figure 4A:
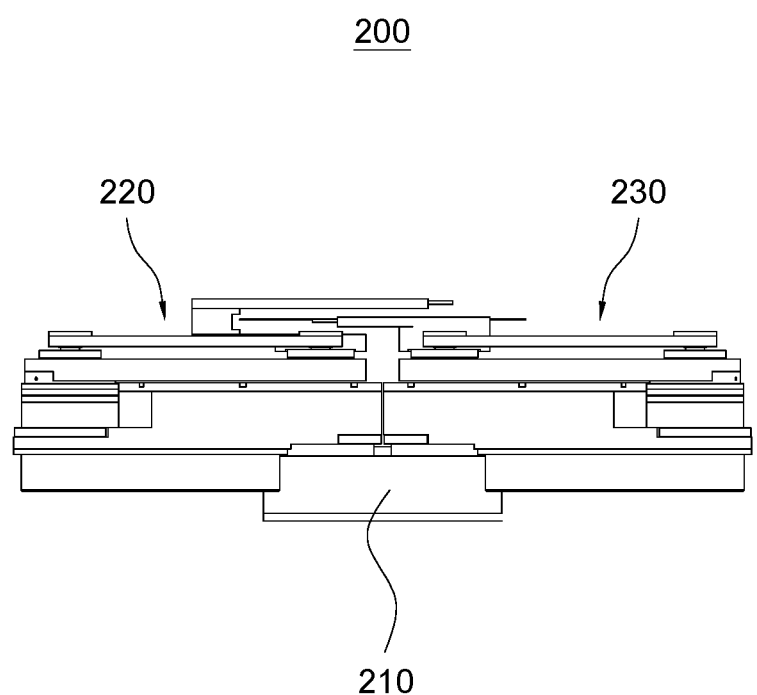
FIG. 4A and FIG. 4B are drawings schematically illustrating a substrate transfer robot to be engaged with the travel robot in accordance with one example embodiment of the present disclosure.
Figure 4B:
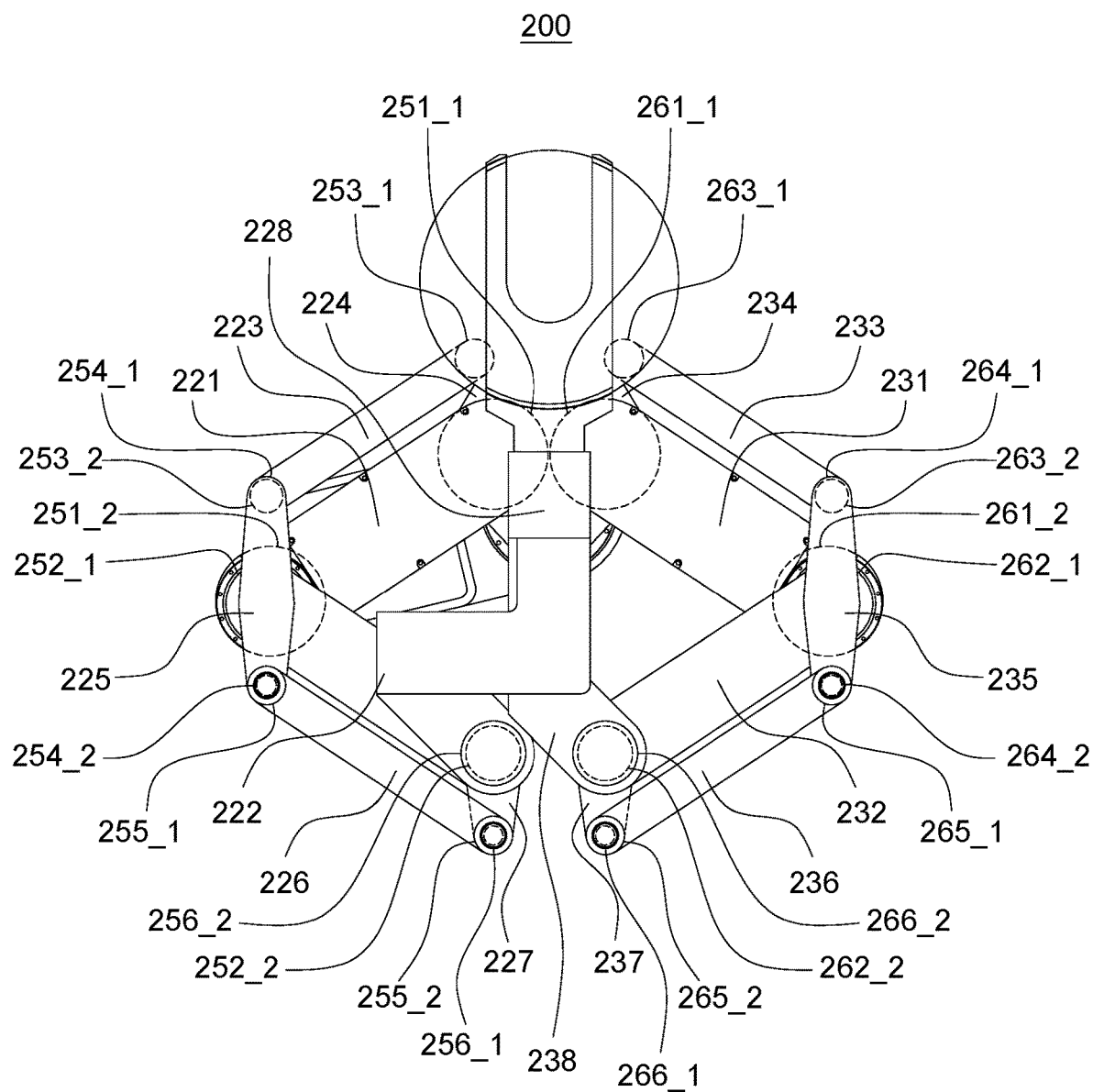

By referring to FIG. 4A and FIG. 4B, the substrate transfer robot 200 may include a transfer arm platform 210 engaged with the third travel link arm, and a first transfer arm part 220 and a second transfer arm part 230 engaged with the transfer arm platform 210, and the first transfer arm part 220 and the second transfer arm part 230 may respectively be engaged with a first end effector 228 and a second end effector 238 for supporting the substrates.

Accordingly, the substrate transfer robot 200 may be moved to the set position by traveling within the transfer chamber by operations of the first travel link arm, the second travel link arm and the third travel link arm of the travel robot or by additional rotational movement of the elevating part of the travel robot. Further, in a state where the first end effector 228 or the second end effector 238 is positioned at a loading position of the substrates or an unloading position of the substrates by the vertical movement of the elevating part of the travel robot, the first end effector 228 or the second end effector 238 may load or unload the substrates by the operations of the first transfer arm part 220 or the second transfer arm part 230.

Figure 5A:
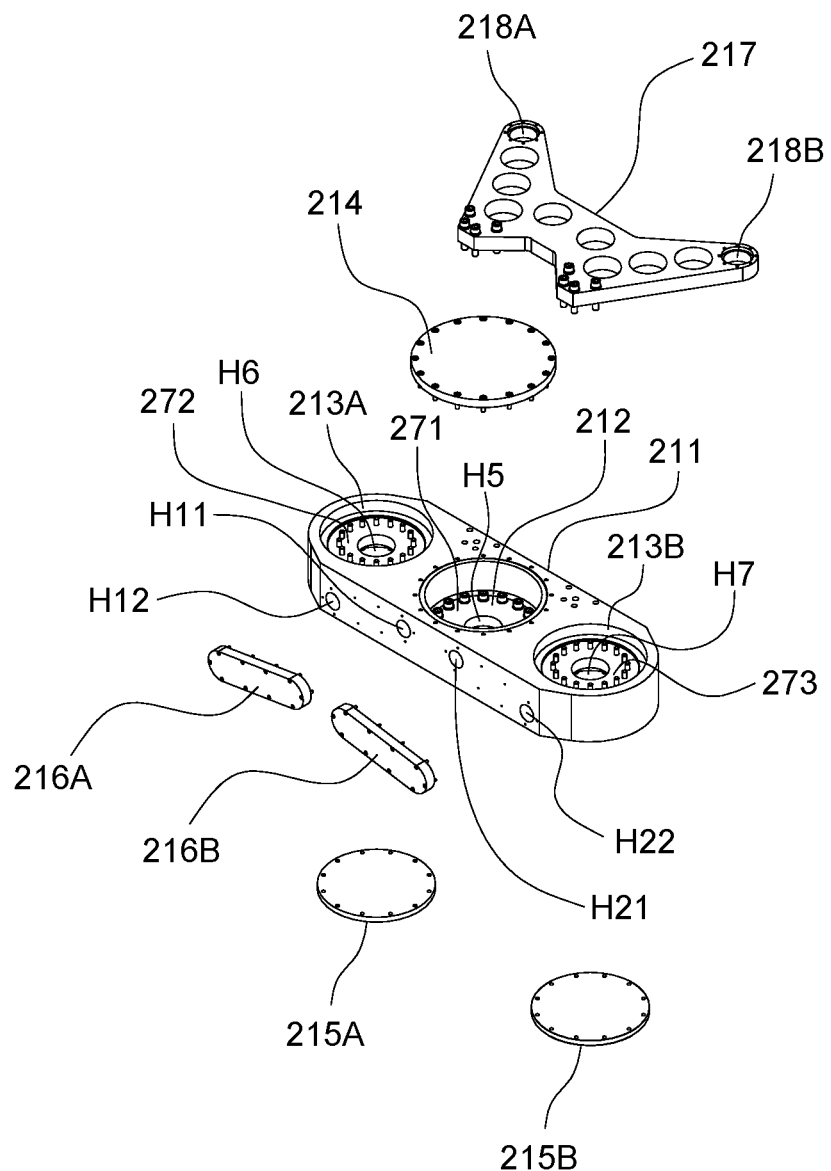
FIG. 5A to FIG. 5C are drawings schematically illustrating a transfer arm platform of the substrate transfer robot to be engaged with the travel robot in accordance with one example embodiment of the present disclosure.
Figure 5B:
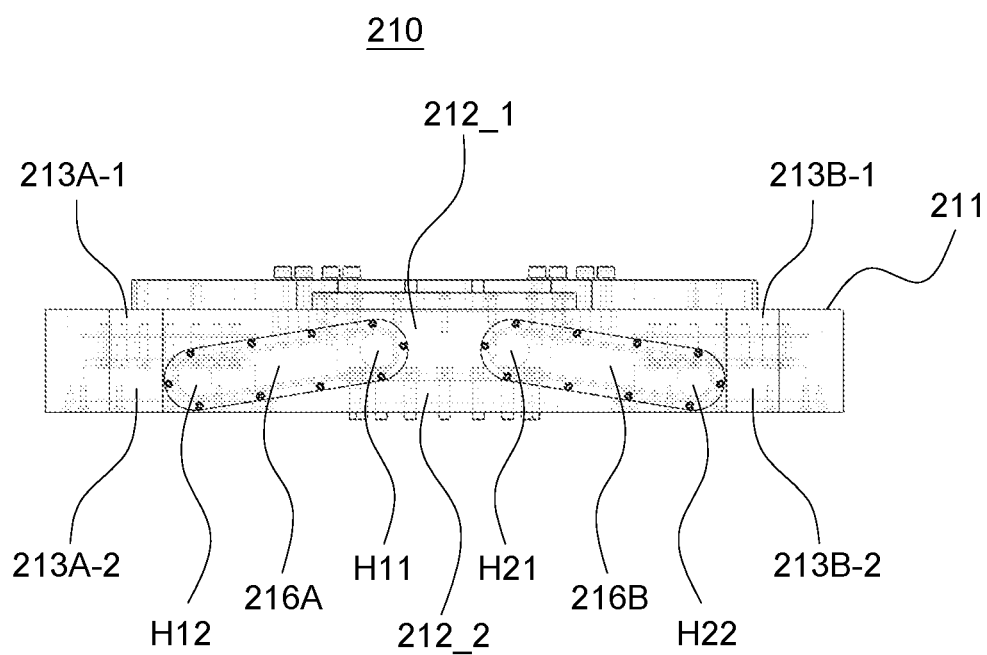
Figure 5C:
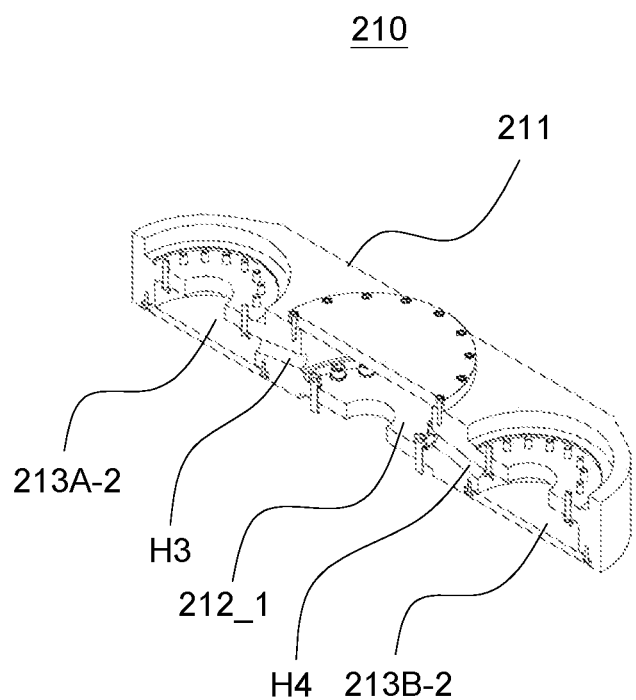

First, by referring to FIG. 5A to FIG. 5C, the transfer arm platform 210 may include a first coupling hole 212 formed at a center area of a body 211 of the transfer arm platform 210, a second coupling hole 213A formed at a fourth one-end area, and a third coupling hole 213B formed at a fourth opposite-end area.

Herein, the first coupling hole 212 at the center area may be compartmentalized into a first upper space 212_1 and a first lower space 212_2 by a first locking member 271 that has a first through-hole H5 corresponding to the rotation drive shaft of the third travel link arm of the travel robot, wherein the first upper space 212_1 is sealed by a first cover 214.

Also, the second coupling hole 213A at the fourth one-end area of the body 211 may be compartmentalized into a second upper space 213A_1 and a second lower space 213A_2 by a second locking member 272 that has a second through-hole H, wherein the second lower space 213A_2 is sealed by a second cover 215A.

In addition, the third coupling hole 213B at the fourth opposite-end area of the body 211 may be compartmentalized into a third upper space 213B_1 and a third lower space 213B_2 by a third locking member 273 that has a third through-hole H7, wherein the third lower space 213B_2 is sealed by a third cover 215B.

Also, the transfer arm platform 210 may have a link connecting member 217 including a first blade 218A and a second blade 218B for link connection that is fixedly engaged at its front area. Herein, a direction of the front area may be a direction of a processing chamber from the substrate transfer robot 200 when the substrate transfer robot 200 is positioned to transfer the substrates to the processing chamber coupled with the transfer chamber.

Further, the transfer arm platform 210 may be engaged with the travel robot, and more specifically, the rotation output shaft of the third travel link arm of the travel robot or a third linking member engaged with the rotation output shaft may be inserted into the first lower space 212_2 of the first coupling hole 212, so that the rotation output shaft of the third travel link arm of the travel robot is fixedly engaged with the first locking member 271. Herein, when the rotation output shaft is fixedly engaged with the first locking member 271, sealing at a coupling area between the rotation output shaft and the first locking member 271 may be improved by adding the sealing members such as the O-ring, the gasket, etc. Since the configuration of adding the sealing members, such as the O-ring, the gasket, etc., may be similarly applied to other coupling areas to be described hereinafter, a description thereof is omitted in the following description of the present disclosure.

Herein, the rotation drive shaft of the third travel link arm of the travel robot may have a hollow formed thereon, and wiring holes may be formed on the transfer arm platform 210 so that wirings inserted through the hollow of the rotation drive shaft may be inserted into the first transfer arm part 220 and the second transfer arm part 230 through the wiring holes.

That is, a (1_1)-st wiring hole H11 and a (1_2)-nd wiring hole H21, each bridging the first upper space 212_1 and one side of the body 211 of the transfer arm platform 210 may be formed. Also, a (2_1)-st wiring hole H12, bridging the second lower space 213A_2 and the one side of the body 211 of the transfer arm platform 210, and a (2_2)-nd wiring hole H22, bridging the third lower space 213B_2 and the one side of the body 211 of the transfer arm platform 210, may be formed.

In addition, for sealing the wiring holes, a first sealing cover 216A that seals the (1_1)-st wiring hole H11 and the (2_1)-st wiring hole H12 at the one side of the body 211 of the transfer arm platform 210 and a second sealing cover 216B that seals the (1_2)-nd wiring hole H21 and the (2_2)-nd wiring hole H22 at the one side of the body 211 of the transfer arm platform 210 may be provided.

Further, the wiring holes for introducing the wirings that are inserted through the rotation drive shaft of the travel robot into the first transfer arm part 220 and the second transfer arm part 230 may also be formed inside the body 211 of the transfer arm platform 210.

That is, within the body 211 of the transfer arm platform 210, a third wiring hole H3, bridging the first upper space 212_1 and the second lower space 213A_2, and a fourth wiring hole H4, bridging the first upper space 212_1 and the third lower space 213B_2, may be formed so that the inside of the transfer arm platform 210 is sealed without using additional sealing members.

Next, a (1_1)-st transfer link arm 221 of the first transfer arm part 220 may be engaged with the transfer arm platform 210 at the second coupling hole 213A of the transfer arm platform 210. Also, a (2_1)-st transfer link arm 231 of the second transfer arm part 230 may be engaged with the transfer arm part platform 210 at the third coupling hole 213B of the transfer arm platform 210.

Figure 6:
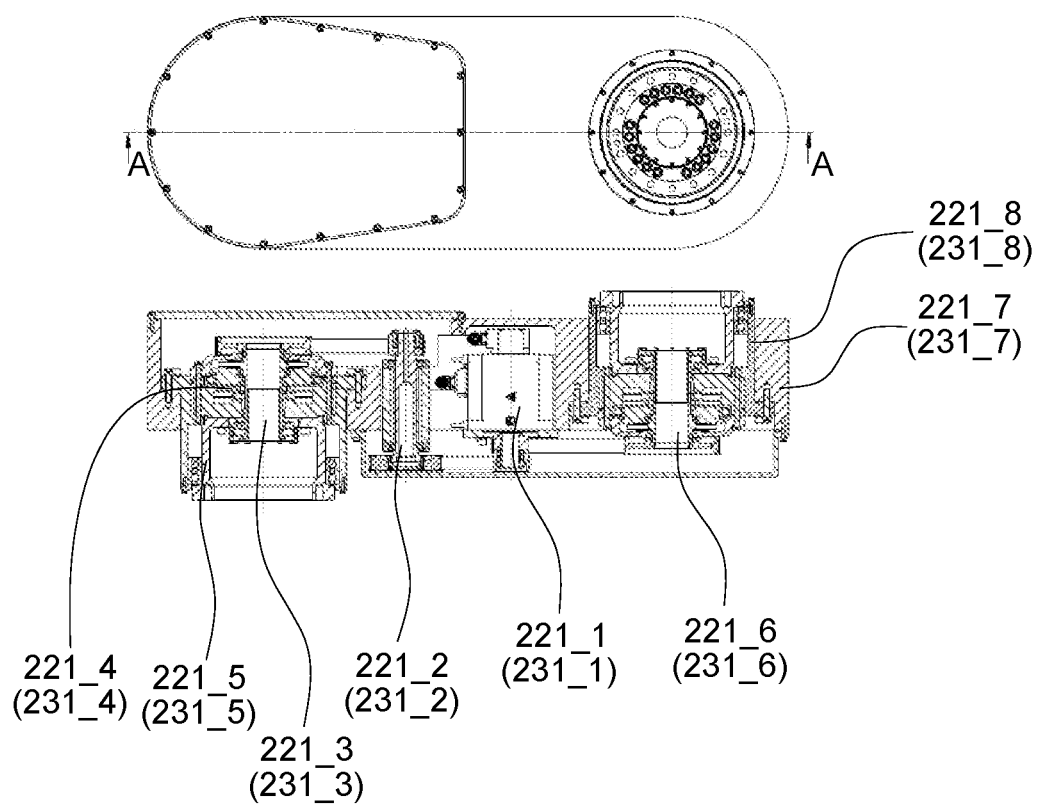
FIG. 6 is a drawing schematically illustrating a (1_1)-st transfer link arm (or a (2_1)-st transfer link arm) of the substrate transfer robot to be engaged with the travel robot in accordance with one example embodiment of the present disclosure.

Herein, by referring to FIG. 6, the (1_1)-st transfer link arm 221 of the first transfer arm part 220 may have a sealed inner space, and a third driving motor 221_1 and a first speed reducer 221_2, interlocked with the third driving motor 221_1 to reduce a rotational speed of the third driving motor 221_1 by half, may be installed in the sealed inner space of the (1_1)-st transfer link arm 221.

Also, a (1_1)-st transfer drive shaft 221_3, having a hollow formed therein and interlocked with the first speed reducer 221_2, and a (1_1)-st transfer output shaft 221_4 interlocked with the (1_1)-st transfer drive shaft 221_3 may be sealingly installed on a (5_1)-st one-end area 251_1 of the (1_1)-st transfer link arm 221. Further, a (1_2)-nd transfer drive shaft 221_6, having a hollow formed therein and interlocked with the third driving motor 221_1, and a (1_2)-nd transfer output shaft 221_7 interlocked with the (1_2)-nd transfer drive shaft 221_6 may be sealingly installed on a (5_1)-st opposite-end area 251_2 of the (1_1)-st transfer link arm 221. Herein, the interlocking between the third driving motor 221_1 and the first speed reducer 221_2, the interlocking between the first speed reducer 221_2 and the (1_1)-st transfer drive shaft 221_3 and the interlocking between the third driving motor 221_1 and the (1_2)-nd transfer drive shaft 221_6 may be respectively achieved by using the pulley mechanism, but the present disclosure is not limited thereto, and various methods, such as the gear method, etc., may be used for transmitting rotational force. Also, a pair of the (1_1)-st transfer drive shaft 221_3 and the (1_1)-st transfer output shaft 221_4, and a pair of the (1_2)-nd transfer drive shaft 221_6 and the (1_2)-nd transfer output shaft 221_7 may be formed with each speed reducer having a same speed reduction ratio with each other. Adding to this, the (1_1)-st transfer output shaft 221_4 and the (1_2)-nd transfer output shaft 221_7 may rotate in opposite directions from each other. Herein, the one-end area or the opposite-end area of arm structures, e.g., transfer link arm, the subordinate link arm, the common link arm, etc., that are located underneath in its relative position with nearby arm structures are indicated using dotted lines in FIG. 4B.

Further, the (1_1)-st transfer output shaft 221_4 that is installed at the (5_1)-st one-end area 251_1 of the (1_1)-st transfer link arm 221 of the first transfer arm part 220 may be inserted into the second upper space 213A_1 of the second coupling hole 213A of the transfer arm platform 210 so as to be fixedly engaged with the second locking member 272.

Herein, a (4_1)-st linking member 221_5 may be used for coupling the (1_1)-st transfer output shaft 221_4 with the second locking member 272. Herein, the (4_1)-st linking member 221_5 may be a tube-shaped shaft, having its length extended by a distance between the (1_1)-st transfer output shaft 221_4 and the second locking member 272, at a location where the transfer arm platform 210 and the (1_1)-st transfer link arm 221 are coupled, and both ends of the (4_1)-st linking member 221_5 may be fixedly coupled with the (1_1)-st transfer output shaft 221_4 and the second locking member 272 respectively.

Also, the (1_2)-nd transfer output shaft 221_7 of the (1_1)-st transfer link arm 221 of the first transfer arm part 220 may be fixedly engaged with a (5_2)-nd one-end area 252_1 of a (1_2)-nd transfer link arm 222.

Herein, a first fixed coupling shaft 221_8 may be used for coupling the (1_2)-nd transfer output shaft 221_7 and the (5_2)-nd one-end area 252_1. Herein, the first fixed coupling shaft 221_8 may be a tube-shaped shaft, having its length extended by a distance between the (1_2)-nd transfer output shaft 221_7 and a coupling region of the (5_2)-nd one-end area 252_1 to be connected to the (1_2)-nd transfer output shaft 221_7, at a location where the (1_1)-st transfer link arm 221 and the (1_2)-nd transfer link arm 222 are coupled, and both ends of the first fixed coupling shaft 221_8 may be fixedly coupled with the (1_2)-nd transfer output shaft 221_7 and the coupling region of the (5_2)-nd one-end area 252_1 respectively.

In addition, a first common link arm 225 may be installed at a location where the (1_2)-nd transfer output shaft 221_7 and the (5_2)-nd one-end area 252_1 are coupled.

That is, a center area of the first common link arm 225 may be rotatably engaged with the first fixed coupling shaft 221_8 that couples the (1_2)-nd transfer output shaft 221_7 and the (5_2)-nd one-end area 252_1.

Also, the first transfer arm part 220 may include a (1_1)-st subordinate link arm 223 that is in parallel with the (1_1)-st transfer link arm 221, wherein a (5_3)-rd one-end area 253_1 of the (1_1)-st subordinate link arm 223 may be rotatably engaged with the first blade 218A of the link connecting member 217 of the transfer arm platform 210, and a (5_3)-rd opposite-end area 253_2 of the (1_1)-st subordinate link arm 223 may be rotatably engaged with a (5_4)-th one-end area 254_1 of the first common link arm 225.

Additionally, the first transfer arm part 220 may include a (1_2)-nd subordinate link arm 226 that is in parallel with the (1_2)-nd transfer link arm 222, wherein a (5_5)-th one-end area 255_1 of the (1_2)-nd subordinate link arm 226 may be rotatably engaged with a (5_4)-th opposite-end area 254_2 of the first common link arm 225.

Further, the first transfer arm part 220 may include a (1_3)-rd subordinate link arm 227 that is in parallel with the first common link arm 225, wherein a (5_6)-th one-end area 256_1 of the (1_3)-rd subordinate link arm 227 may be rotatably engaged with a (5_5)-th opposite-end area 255_2 of the (1_2)-nd subordinate link arm 226, and a (5_6)-th opposite-end area 256_2 of the (1_3)-rd subordinate link arm 227 may be rotatably engaged with a (5_2)-nd opposite-end area 252_2 of the (1_2)-nd transfer link arm 222.

Also, the first transfer arm part 220 may include the first end effector 228, and the first end effector 228 may be fixed to the (5_6)-th opposite-end area 256_2 of the (1_3)-rd subordinate link arm 227 to thereby support the substrates.

The first transfer arm part 220 configured as above may make the first end effector 228 move forward and backward along a straight line by each of the transfer arms and the subordinate arms according to an operation of the third driving motor 221_1. Accordingly, the substrates may be loaded or unloaded at a position set by the first end effector 228.

Meanwhile, the second transfer arm part 230 may be configured similarly as the first transfer arm part 220, and the first transfer arm part 220 and the second transfer arm part 230 may be installed on the transfer arm platform 210 so as to be symmetrical to each other with respect to a central region of the transfer arm platform 210.

That is, the (2_1)-st transfer link arm 231 of the second transfer arm part 230 may have a sealed inner space, and a fourth driving motor 231_1 and a second speed reducer 231_2, interlocked with the fourth driving motor 231_1 to reduce a rotational speed of the fourth driving motor 231_1 by half, may be installed in the sealed inner space of the (2_1)-st transfer link arm 231. Herein, the (2_1)-st transfer link arm 231, positioned symmetrically to the (1_1)-st transfer link arm 221, may be configured in a similar way as the (1_1)-st transfer link arm 221. Therefore, the structure of the (2_1)-st transfer link arm 231 is also described using FIG. 6 herein, with the reference numbers of the parts constituting the (2_1)-st transfer link arm being indicated in the brackets.

Also, a (2_1)-st transfer drive shaft 231_3, having a hollow formed therein and interlocked with the second speed reducer 231_2, and a (2_1)-st transfer output shaft 231_4 interlocked with the (2_1)-st transfer drive shaft 231_3 may be sealingly installed on a (6_1)-st one-end area 261_1 of the (2_1)-st transfer link arm 231. Further, a (2_2)-nd transfer drive shaft 231_6, having a hollow formed therein and interlocked with the fourth driving motor 231_1, and a (2_2)-nd transfer output shaft 231_7 interlocked with the (2_2)-nd transfer drive shaft 231_6 may be sealingly installed on a (6_1)-st opposite-end area 261_2 of the (2_1)-st transfer link arm 231. Herein, the interlocking between the fourth driving motor 231_1 and the second speed reducer 231_2, the interlocking between the second speed reducer 231_2 and the (2_1)-st transfer drive shaft 231_3 and the interlocking between the fourth driving motor 231_1 and the (2_2)-nd transfer drive shaft 231_6 may be respectively achieved by using the pulley mechanism, but the present disclosure is not limited thereto, and various methods, such as the gear method, etc., may be used for transmitting rotational force. Also, a pair of the (2_1)-st transfer drive shaft 231_3 and the (2_1)-st transfer output shaft 231_4, and a pair of the (2_2)-nd transfer drive shaft 231_6 and the (2_2)-nd transfer output shaft 231_7 may be formed with each speed reducer having a same speed reduction ratio with each other. Adding to this, the (2_1)-st transfer output shaft 231_4 and the (2_2)-nd transfer output shaft 231_7 may rotate in opposite directions from each other.

Further, the (2_1)-st transfer output shaft 231_4 that is installed at the (6_1)-st one-end area 261_1 of the (2_1)-st transfer link arm 231 of the second transfer arm part 230 may be inserted into the third upper space 213B_1 of the third coupling hole 213B of the transfer arm platform 210 so as to be fixedly engaged with the third locking member 273.

Herein, a (4_2)-nd linking member 231_5 may be used for coupling the (2_1)-st transfer output shaft 231_4 and the third locking member 273. Herein, the (4_2)-nd linking member 231_5 may be a tube-shaped shaft, having its length extended by a distance between the (2_1)-st transfer output shaft 231_4 and the third locking member 273, at a location where the transfer arm platform 210 and the (2_1)-st transfer link arm 231 are coupled, and both ends of the (4_2)-nd linking member 231_5 may be fixedly coupled with the (2_1)-st transfer output shaft 231_4 and the third locking member 273 respectively.

Also, the (2_2)-nd transfer output shaft 231_7 of the (2_1)-st transfer link arm 231 of the second transfer arm part 230 may be fixedly engaged with a (6_2)-nd one-end area 262_1 of a (2_2)-nd transfer link arm 232.

Herein, a second fixed coupling shaft 231_8 may be used for coupling the (2_2)-nd transfer output shaft 231_7 and the (6_2)-nd one-end area 262_1. Herein, the second fixed coupling part may be a tube-shaped shaft, having its length extended by a distance between the (2_2)-nd transfer output shaft 231_7 and a coupling region of the (6_2)-nd one-end area 262_1 to be connected to the (2_2)-nd transfer output shaft 231_7, at a location where the (2_1)-st transfer link arm 231 and the (2_2)-nd transfer link arm 232 are coupled, and both ends of the second fixed coupling shaft 231_8 may be fixedly coupled with the (2_2)-nd transfer output shaft 231_7 and the coupling region of the (6_2)-nd one-end area 262_1 respectively.

In addition, a second common link arm 235 may be installed at a location where the (2_2)-nd transfer output shaft 231_7 and the (6_2)-nd one-end area 262_1 are coupled.

That is, a center area of the second common link arm 235 may be rotatably engaged with the second fixed coupling shaft 231_8 that couples the (2_2)-nd transfer output shaft 231_7 and the (6_2)-nd one-end area 262_1.

Also, the second transfer arm part 230 may include a (2_1)-st subordinate link arm 233 that is in parallel with the (2_1)-st transfer link arm 231, wherein a (6_3)-rd one-end area 263_1 of the (2_1)-st subordinate link arm 233 may be rotatably engaged with the second blade 218B of the link connecting member 217 of the transfer arm platform 210, and a (6_3)-rd opposite-end area 263_2 of the (2_1)-st subordinate link arm 233 may be rotatably engaged with a (6_4)-th one-end area 264_1 of the second common link arm 235.

Additionally, the second transfer arm part 230 may include a (2_2)-nd subordinate link arm 236 that is in parallel with the (2_2)-nd transfer link arm 232, wherein a (6_5)-th one-end area 265_1 of the (2_2)-nd subordinate link arm 236 may be rotatably engaged with a (6_4)-th opposite-end area 264_2 of the second common link arm 235.

Further, the second transfer arm part 230 may include a (2_3)-rd subordinate link arm 237 that is in parallel with the second common link arm 235, wherein a (6_6)-th one-end area 266_1 of the (2_3)-rd subordinate link arm 237 may be rotatably engaged with a (6_5)-th opposite-end area 265_2 of the (2_2)-nd subordinate link arm 236, and a (6_6)-th opposite-end area 266_2 of the (2_3)-rd subordinate link arm 237 may be rotatably engaged with a (6_2)-nd opposite-end area 262_2 of the (2_2)-nd transfer link arm 232.

Also, the second transfer arm part 230 may include the second end effector 238, and the second end effector 238 may be fixed to the (6_6)-th opposite-end area 266_2 of the (2_3)-rd subordinate link arm 237 to thereby support the substrates.

The second transfer arm part 230 configured as above may make the second end effector 238 move forward and backward along a straight line by each of the transfer arms and the subordinate arms according to an operation of the fourth driving motor 231_1. Accordingly, the substrates may be loaded or unloaded at a position set by the second end effector 238.

Also, while the first end effector 228 of the first transfer arm part 220 may be fixedly engaged with the (5_6)-th opposite-end area 256_2 of the (1_3)-rd subordinate link arm, the second end effector 238 of the second transfer arm part 230 may be fixedly engaged with the (6_6)-th opposite-end area 266_2 of the (2_3)-rd subordinate link arm through a bracket so that the second end effector 238 is at a different height from the first end effector 228. Herein, the bracket may be formed in a "1" shape, but the present disclosure is not limited thereto. For reference, "1" is a Korean alphabet.

Accordingly, the first end effector 228 of the first transfer arm 220 and the second end effector 238 of the second transfer arm 230 may be separated by a distance between an upper surface and a lower surface of the bracket, and thus support the substrates at different heights.

Also, when the substrates are being transferred by the operations of the first transfer arm part 220 and the second transfer arm part 230, the first end effector 228 or a substrate supported by the first end effector 228 may be moved through a space in-between the upper surface and the lower surface of the bracket to thereby prevent any contact between the first end effector 228 and the second end effector 238.

However, the present disclosure is not limited thereto, and may also encompass a case where heights of the first end effector 228 and the second end effector 238 are reversed by changing the installation position of the bracket, or a case where the heights of the first end effector 228 and the second end effector 238 are made to be different from each other by using various mechanical configurations aside from the bracket.

Meanwhile, although a characteristic configuration of the substrate transfer robot 200 supported by the travel robot 100 is described above, the present disclosure is not limited to the configuration of the substrate transfer robot described above, and any types of substrate transfer robots that transfer the substrates inside the transfer chamber may be coupled with the travel robot, so as to perform the traveling of the substrate transfer robot inside the transfer chamber by the travel robot and the substrate transfer inside the transfer chamber by the substrate transfer robot.

In addition, although the transfer of the substrates has been described above, the present disclosure may also be applied to a transfer of masks necessary for processing the substrates.

The present disclosure has an effect of installing the travel robot in the transfer chamber to thereby enable the moving of the substrate transfer robot that transfers the substrates within the transfer chamber.

The present disclosure has another effect of facilitating easy installation of the travel robot in the transfer chamber without having to install a separate structure for creating a transport path by building the travel robot in a link arm structure.

The present disclosure has still another effect of facilitating easy maintenance of the travel robot by installing the travel robot that is built of the link arm structure instead of installing the separate structure for creating the transport path.

The present disclosure has still yet another effect of forming a driving unit of the travel robot in a sealed structure and forming wirings required for the operation of the driving unit inside the travel robot so that possible pollution sources are blocked in advance and a vacuum state of the transfer chamber is maintained.

As seen above, the present disclosure has been explained by specific matters such as detailed components, limited embodiments, and drawings. While the invention has been shown and described with respect to the preferred embodiments, it, however, will be understood by those skilled in the art that various changes and modification may be made without departing from the spirit and scope of the invention as defined in the following claims.

Accordingly, the thought of the present disclosure must not be confined to the explained embodiments, and the following patent claims as well as everything including variations equal or equivalent to the patent claims pertain to the category of the thought of the present disclosure.

What is claimed is:

1. A travel robot for moving a substrate transfer robot in a transfer chamber, comprising:
    an elevating part for vertically and rotationally driving an elevating drive shaft installed in the transfer chamber;
    a first travel link arm having a first one-end area engaged with the elevating drive shaft;
    a second travel link arm having a first driving motor installed in a sealed inner space therein, wherein a first travel drive shaft interlocked with the first driving motor and a first travel output shaft interlocked with the first travel drive shaft are sealingly installed on a second one-end area of the second travel link arm, wherein a second travel drive shaft interlocked with the first driving motor and a second travel output shaft interlocked with the second travel drive shaft are sealingly installed on a second opposite-end area of the second travel link arm, and wherein the first travel output shaft is engaged with a first opposite-end area of the first travel link arm; and
    a third travel link arm having a second driving motor installed in a sealed inner space therein, wherein a rotation drive shaft interlocked with the second driving motor and a rotation output shaft interlocked with the rotation drive shaft are installed on a third opposite-end area of the third travel link arm, wherein the second travel output shaft of the second travel link arm is engaged with a third one-end area of the third travel link arm, and wherein the substrate transfer robot is engaged with the rotation output shaft, wherein the substrate transfer robot includes:
    a transfer arm platform through which a first coupling hole, a second coupling hole and a third coupling hole are formed respectively at a center area, a fourth one-end area and a fourth opposite-end area thereof, wherein a first locking member, through which a first through-hole corresponding to the rotation drive shaft of the third travel link arm is formed, compartmentalizes the first coupling hole into a first upper space and a first lower space, wherein the first upper space is sealed by a first cover, wherein a second locking member, through which a second through-hole is formed, compartmentalizes the second coupling hole into a second upper space and a second lower space, wherein the second lower space is sealed by a second cover, wherein a third locking member, through which a third through-hole is formed, compartmentalizes the third coupling hole into a third upper space and a third lower space, wherein the third lower space is sealed by a third cover, wherein a link connecting member including a first blade and a second blade for link connection is fixedly engaged at a front area, with a direction of the front area being a direction of a processing chamber from the substrate transfer robot when the substrate transfer robot is positioned to transfer a substrate to the processing chamber coupled with the transfer chamber, and wherein a third linking member, inserted into the first lower space and fixedly engaged with the first locking member, is fixedly engaged with the rotation output shaft;
    a first transfer arm part including a (1_1)-st transfer link arm, a (1_2)-nd transfer link arm, a first common link arm, a (1_1)-st subordinate link arm parallel to the (1_1)-st transfer link arm, a (1_2)-nd subordinate link arm parallel to the (1_2)-nd transfer link arm, a (1_3)-rd subordinate link arm parallel to the first common link arm, and a first end effector, wherein a third driving motor and a first speed reducer, interlocked with the third driving motor to reduce a rotational speed of the third driving motor by half, are installed in a sealed inner space of the (1_1)-st transfer link arm, wherein a (1_1)-st transfer drive shaft interlocked with the first speed reducer and a (1_1)-st transfer output shaft interlocked with the (1_1)-st transfer drive shaft are sealingly installed on a (5_1)-st one-end area of the (1_1)-st transfer link arm, wherein a (1_2)-nd transfer drive shaft interlocked with the third driving motor and a (1_2)-nd transfer output shaft interlocked with the (1_2)-nd transfer drive shaft are sealingly installed on a (5_1)-st opposite-end area of the (1_1)-st transfer link arm, wherein the (1_1)-st transfer output shaft of the (1_1)-st transfer link arm is fixedly engaged with a (4_1)-st linking member that is inserted into the second upper space of the transfer arm platform to be fixedly engaged with the second locking member, wherein a (5_2)-nd one-end area of the (1_2)-nd transfer link arm is fixedly engaged with the (1-2)-nd transfer output shaft of the (1_1)-st transfer link arm through a first fixed coupling shaft, wherein the first common link arm is rotatably engaged with the first fixed coupling shaft, wherein a (5_3)-rd one-end area of the (1_1)-st subordinate link arm is rotatably engaged with the first blade of the link connecting member of the transfer arm platform, and a (5_3)-rd opposite-end area of the (1_1)-st subordinate link arm is rotatably engaged with a (5_4)-th one-end area of the first common link arm, wherein a (5_5)-th one-end area of the (1_2)-nd subordinate link arm is rotatably engaged with a (5_4)-th opposite-end area of the first common link arm, wherein a (5_6)-th one-end area of the (1_3)-rd subordinate link arm is rotatably engaged with a (5_5)-th opposite-end area of the (1_2)-nd subordinate link arm, and a (5_6)-th opposite-end area of the (1_3)-rd subordinate link arm is rotatably engaged with a (5_2)-nd opposite-end area of the (1_2)-nd transfer link arm, and wherein the first end effector is fixed to the (5_6)-th opposite-end area of the (1_3)-rd subordinate link arm to thereby support the substrate; and a second transfer arm part including a (2_1)-st transfer link arm, a (2_2)-nd transfer link arm, a second common link arm, a (2_1)-st subordinate link arm parallel to the (2_1)-st transfer link arm, a (2_2)-nd subordinate link arm parallel to the (2_2)-nd transfer link arm, a (2_3)-rd subordinate link arm parallel to the second common link arm, and a second end effector, wherein a fourth driving motor and a second speed reducer, interlocked with the fourth driving motor to reduce a rotational speed of the fourth driving motor by half, are installed in a sealed inner space of the (2_1)-st transfer link arm, wherein a (2_1)-st transfer drive shaft interlocked with the second speed reducer and a (2_1)-st transfer output shaft interlocked with the (2_1)-st transfer drive shaft are sealingly installed on a (6_1)-st one-end area of the (2_1)-st transfer link arm, wherein a (2_2)-nd transfer drive shaft interlocked with the fourth driving motor and a (2_2)-nd transfer output shaft interlocked with the (2_2)-nd transfer drive shaft are sealingly installed on a (6_1)-st opposite-end area of the (2_1)-st transfer link arm, wherein the (2_1)-st transfer output shaft of the (2_1)-st transfer link arm is fixedly engaged with a (4_2)-nd linking member that is inserted into the third upper space of the transfer arm platform to be fixedly engaged with the third locking member, wherein a (6_2)-nd one-end area of the (2_2)-nd transfer link arm is fixedly engaged with the (2-2)-nd transfer output shaft of the (2_1)-st transfer link arm through a second fixed coupling shaft, wherein the second common link arm is rotatably engaged with the second fixed coupling shaft, wherein a (6_3)-rd one-end area of the (2_1)-st subordinate link arm is rotatably engaged with the second blade of the link connecting member of the transfer arm platform, and a (6_3)-rd opposite-end area of the (2_1)-st subordinate link arm is rotatably engaged with a (6_4)-th one-end area of the second common link arm, wherein a (6_5)-th one-end area of the (2_2)-nd subordinate link arm is rotatably engaged with a (6_4)-th opposite-end area of the second common link arm, wherein a (6_6)-th one-end area of the (2_3)-rd subordinate link arm is rotatably engaged with a (6_5)-th opposite-end area of the (2_2)-nd subordinate link arm, and a (6_6)-th opposite-end area of the (2_3)-rd subordinate link arm is rotatably engaged with a (6_2)-nd opposite-end area of the (2_2)-nd transfer link arm, and wherein the second end effector is fixed to the (6_6)-th opposite-end area of the (2_3)-rd subordinate link arm to thereby support the substrate.

2. The travel robot of claim 1, wherein the elevating part located in a lower outer region of a housing capable of sealing an inside of the transfer chamber has its upper end sealed to a transfer chamber through-hole formed on a lower region of the housing, and allows the elevating drive shaft to move up and down through the transfer chamber through-hole.

3. The travel robot of claim 1, wherein a rotational speed of the elevating drive shaft, a rotational speed of the first travel drive shaft and a rotational speed of the second travel drive shaft have a speed ratio of 1:2:2.

4. The travel robot of claim 1, wherein a rotational speed of the elevating drive shaft, a rotational speed of the first travel drive shaft, a rotational speed of the second travel drive shaft and a rotational speed of the rotation drive shaft have a speed ratio of 1:2:2:1.

5. The travel robot of claim 1, wherein the elevating drive shaft of the elevating part includes an elevating output shaft, which is interlocked with the elevating drive shaft and engaged with the first one-end area of the first travel link arm, and
wherein a rotational speed of the elevating output shaft, a rotational speed of the first travel output shaft and a rotational speed of the second travel output shaft have a speed ratio of 1:2:2.

6. The travel robot of claim 1, wherein the elevating drive shaft of the elevating part includes an elevating output shaft, which is interlocked with the elevating drive shaft and engaged with the first one-end area of the first travel link arm, and
wherein a rotational speed of the elevating output shaft, a rotational speed of the first travel output shaft, a rotational speed of the second travel output shaft and a rotational speed of the rotation output shaft have a speed ratio of 1:2:2:1.

7. The travel robot of claim 1, wherein the first travel output shaft is engaged with the first opposite-end area by a first linking member that has its first one-side engaged with the first travel output shaft and its first opposite-side engaged with the first opposite-end area, and
wherein the second travel output shaft is engaged with the third one-end area by a second linking member that has its second one-side engaged with the second travel output shaft and its second opposite-side engaged with the third one-end area.

8. The travel robot of claim 1, wherein a distance between the elevating drive shaft and the first travel drive shaft, a distance between the first travel drive shaft and the second travel drive shaft, and a distance between the second travel drive shaft and the rotation drive shaft have a distance ratio of 1:2:1.

9. The travel robot of claim 1, wherein the elevating drive shaft, the first travel drive shaft, the second travel drive shaft and the rotation drive shaft have their corresponding hollows formed thereon, and wherein wires for controlling the first driving motor, the second driving motor and the substrate transfer robot are installed inside the first travel link arm, the second travel link arm and the third travel link arm via the hollows.

10. The travel robot of claim 1, wherein the first end effector is fixed to the (5_6)-th opposite-end area through a bracket, or the second end effector is fixed to the (6_6)-th opposite-end area through the bracket.

11. The travel robot of claim 1, wherein the transfer arm platform further includes: a first wiring hole bridging the first upper space and the second lower space; and a second wiring hole bridging the first upper space and the third lower space.

* * * * *